US008630098B2

(12) United States Patent
Handelsman et al.

(10) Patent No.: US 8,630,098 B2
(45) Date of Patent: Jan. 14, 2014

(54) SWITCHING CIRCUIT LAYOUT WITH HEATSINK

(75) Inventors: Lior Handelsman, Givatayim (IL); Tzachi Glovinsky, Petach Tikva (IL); Amir Grossberg, Tel Aviv (IL); Sönke Rogalia, Freiburg (DE); Heribert Schmidt, Freiburg (DE)

(73) Assignee: Solaredge Technologies Ltd., Herzelia (IL)

( * ) Notice: Subject to any disclaimer, the term of this patent is extended or adjusted under 35 U.S.C. 154(b) by 441 days.

(21) Appl. No.: 12/483,933

(22) Filed: Jun. 12, 2009

(65) Prior Publication Data

US 2010/0124027 A1   May 20, 2010

Related U.S. Application Data

(60) Provisional application No. 61/060,878, filed on Jun. 12, 2008.

(51) Int. Cl.
*H05K 7/02* (2006.01)
*H05K 7/06* (2006.01)
*H05K 7/08* (2006.01)
*H05K 7/10* (2006.01)

(52) U.S. Cl.
USPC ........... 361/781; 361/709; 361/753; 361/782; 361/784; 361/832

(58) Field of Classification Search
USPC .................. 361/753, 780–784, 823–830; 362/230–232, 609–612
See application file for complete search history.

(56) References Cited

U.S. PATENT DOCUMENTS

| 3,369,210 A | 2/1968 | Manickella |
| 3,596,229 A | 7/1971 | Hohorst |
| 4,171,861 A | 10/1979 | Hohorst |
| 4,452,867 A | 6/1984 | Conforti |
| 4,460,232 A | 7/1984 | Sotolongo |
| 4,623,753 A | 11/1986 | Feldman et al. |
| 4,637,677 A | 1/1987 | Barkus |
| 4,641,079 A | 2/1987 | Kato et al. |

(Continued)

FOREIGN PATENT DOCUMENTS

| EP | 0420295 | 4/1991 |
| EP | 0604777 | 7/1994 |

(Continued)

OTHER PUBLICATIONS

International Search Report for PCT/IB2007/004610 dated Feb. 23, 2009.

(Continued)

*Primary Examiner* — Tuan T Dinh
(74) *Attorney, Agent, or Firm* — Banner & Witcoff, Ltd.

(57) ABSTRACT

A circuit board adapted for use in an switching converter for connecting a plurality of switches including a first switch, a second switch, a third switch and a fourth switch. The circuit board has a layout for connecting the switches. The layout is adapted for locating the switches substantially at or symmetrically with respect to the endpoints of a right-angle cross. The right-angle cross is formed from two line segments intersecting with a ninety degree angle. The circuit board may offsets the switches perpendicularly to the line segments at the endpoints of the line segments either in a clockwise or a counterclockwise direction.

12 Claims, 5 Drawing Sheets

(56) References Cited

U.S. PATENT DOCUMENTS

| | | |
|---|---|---|
| 4,783,728 A | 11/1988 | Hoffman |
| 4,903,851 A | 2/1990 | Slough |
| 4,987,360 A | 1/1991 | Thompson |
| 5,045,988 A | 9/1991 | Gritter et al. |
| 5,280,232 A | 1/1994 | Kohl et al. |
| 5,460,546 A | 10/1995 | Kunishi et al. |
| 5,497,289 A | 3/1996 | Sugishima et al. |
| 5,548,504 A | 8/1996 | Takehara |
| 5,604,430 A | 2/1997 | Decker et al. |
| 5,646,501 A | 7/1997 | Fishman et al. |
| 5,773,963 A | 6/1998 | Blanc et al. |
| 5,780,092 A | 7/1998 | Agbo et al. |
| 5,798,631 A | 8/1998 | Spee et al. |
| 5,801,519 A | 9/1998 | Midya et al. |
| 5,804,894 A | 9/1998 | Leeson et al. |
| 5,821,734 A | 10/1998 | Faulk |
| 5,822,186 A | 10/1998 | Bull et al. |
| 5,838,148 A | 11/1998 | Kurokami et al. |
| 5,869,956 A | 2/1999 | Nagao et al. |
| 5,873,738 A | 2/1999 | Shimada et al. |
| 5,892,354 A | 4/1999 | Nagao et al. |
| 5,923,158 A | 7/1999 | Kurokami et al. |
| 5,933,327 A * | 8/1999 | Leighton et al. ............... 361/719 |
| 5,945,806 A | 8/1999 | Faulk |
| 5,963,010 A | 10/1999 | Hayashi et al. |
| 5,990,659 A | 11/1999 | Frannhagen |
| 6,031,736 A | 2/2000 | Takehara et al. |
| 6,038,148 A * | 3/2000 | Farrington et al. ........ 363/21.06 |
| 6,046,919 A | 4/2000 | Madenokouji et al. |
| 6,050,779 A | 4/2000 | Nagao et al. |
| 6,082,122 A | 7/2000 | Madenokouji et al. |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,163,086 A | 12/2000 | Choo |
| 6,166,455 A | 12/2000 | Li |
| 6,166,527 A | 12/2000 | Li |
| 6,169,678 B1 | 1/2001 | Kondo et al. |
| 6,259,234 B1 | 7/2001 | Perol |
| 6,262,558 B1 | 7/2001 | Weinberg |
| 6,285,572 B1 | 9/2001 | Onizuka et al. |
| 6,320,769 B2 | 11/2001 | Kurokami et al. |
| 6,339,538 B1 | 1/2002 | Handleman |
| 6,493,246 B2 | 12/2002 | Suzui et al. |
| 6,531,848 B1 | 3/2003 | Chitsazan et al. |
| 6,545,211 B1 | 4/2003 | Mimura |
| 6,548,205 B2 | 4/2003 | Leung et al. |
| 6,590,793 B1 | 7/2003 | Nagao et al. |
| 6,608,468 B2 | 8/2003 | Nagase |
| 6,611,441 B2 | 8/2003 | Kurokami et al. |
| 6,672,018 B2 | 1/2004 | Shingleton |
| 6,678,174 B2 | 1/2004 | Suzui et al. |
| 6,690,590 B2 | 2/2004 | Stamenic et al. |
| 6,738,692 B2 | 5/2004 | Schienbein et al. |
| 6,768,047 B2 | 7/2004 | Chang et al. |
| 6,788,033 B2 | 9/2004 | Vinciarelli |
| 6,795,318 B2 | 9/2004 | Haas et al. |
| 6,801,442 B2 | 10/2004 | Suzui et al. |
| 6,914,418 B2 | 7/2005 | Sung |
| 6,919,714 B2 | 7/2005 | Delepaut |
| 6,936,995 B2 | 8/2005 | Kapsokavathis et al. |
| 6,963,147 B2 | 11/2005 | Kurokami et al. |
| 6,984,970 B2 | 1/2006 | Capel |
| 7,030,597 B2 | 4/2006 | Bruno et al. |
| 7,031,176 B2 | 4/2006 | Kotsopoulos et al. |
| 7,042,195 B2 | 5/2006 | Tsunetsugu et al. |
| 7,046,531 B2 | 5/2006 | Zocchi et al. |
| 7,053,506 B2 | 5/2006 | Alonso et al. |
| 7,072,194 B2 | 7/2006 | Nayar et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,091,707 B2 | 8/2006 | Cutler |
| 7,126,053 B2 | 10/2006 | Kurokami et al. |
| 7,126,294 B2 | 10/2006 | Minami et al. |
| 7,148,669 B2 | 12/2006 | Maksimovic et al. |
| 7,291,036 B1 | 11/2007 | Daily et al. |
| 7,385,833 B2 | 6/2008 | Keung |
| 7,420,815 B2 | 9/2008 | Love |
| 7,435,134 B2 | 10/2008 | Lenox |
| 7,435,897 B2 | 10/2008 | Russell |
| 7,600,349 B2 | 10/2009 | Liebendorfer |
| 7,748,175 B2 | 7/2010 | Liebendorfer |
| 7,759,575 B2 | 7/2010 | Jones et al. |
| 7,763,807 B2 | 7/2010 | Richter |
| 7,780,472 B2 | 8/2010 | Lenox |
| 7,960,650 B2 | 6/2011 | Richter et al. |
| 8,003,885 B2 | 8/2011 | Richter et al. |
| 2003/0080741 A1 | 5/2003 | LeRow et al. |
| 2004/0201279 A1 | 10/2004 | Templeton |
| 2005/0057214 A1 | 3/2005 | Matan |
| 2005/0057215 A1 | 3/2005 | Matan |
| 2005/0068820 A1 | 3/2005 | Radosevich et al. |
| 2005/0172995 A1 | 8/2005 | Rohrig et al. |
| 2006/0001406 A1 | 1/2006 | Matan |
| 2006/0038692 A1 | 2/2006 | Schnetker |
| 2006/0108979 A1 | 5/2006 | Daniel et al. |
| 2006/0149396 A1 | 7/2006 | Templeton |
| 2006/0162772 A1 | 7/2006 | Presher, Jr. et al. |
| 2006/0174939 A1 | 8/2006 | Matan |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2007/0013080 A1 * | 1/2007 | DiBene et al. ................ 257/777 |
| 2007/0044837 A1 | 3/2007 | Simburger et al. |
| 2007/0147075 A1 * | 6/2007 | Bang ............................ 362/609 |
| 2007/0159866 A1 | 7/2007 | Siri |
| 2008/0080177 A1 * | 4/2008 | Chang .......................... 362/231 |
| 2008/0097655 A1 | 4/2008 | Hadar et al. |
| 2008/0136367 A1 | 6/2008 | Adest et al. |
| 2008/0136732 A1 * | 6/2008 | O'Connell et al. ........... 343/873 |
| 2008/0144294 A1 | 6/2008 | Adest et al. |
| 2008/0238195 A1 | 10/2008 | Shaver et al. |
| 2009/0084570 A1 | 4/2009 | Gherardini et al. |
| 2009/0282755 A1 | 11/2009 | Abbott et al. |
| 2010/0269430 A1 | 10/2010 | Haddock et al. |
| 2010/0282290 A1 | 11/2010 | Schwarze et al. |
| 2010/0294528 A1 | 11/2010 | Sella et al. |
| 2010/0294903 A1 | 11/2010 | Shmukler et al. |
| 2010/0297860 A1 | 11/2010 | Shmukler et al. |
| 2011/0114154 A1 | 5/2011 | Lichy et al. |
| 2011/0271611 A1 | 11/2011 | Maracci et al. |

FOREIGN PATENT DOCUMENTS

| | | |
|---|---|---|
| EP | 1531545 | 5/2005 |
| EP | 1657797 | 5/2006 |
| ES | 2249147 | 3/2006 |
| JP | 2003134667 | 5/2003 |
| JP | 2007058845 | 3/2007 |
| WO | 9313587 | 7/1993 |
| WO | 9613093 | 5/1996 |
| WO | 9823021 | 5/1998 |
| WO | 03050938 | 6/2003 |
| WO | 03071655 | 8/2003 |
| WO | 2004023278 | 3/2004 |
| WO | 2004090993 | 10/2004 |
| WO | 2004107543 | 12/2004 |
| WO | 2005076445 | 8/2005 |
| WO | 2006078685 | 7/2006 |
| WO | 2007006564 | 1/2007 |
| WO | 2007084196 | 7/2007 |
| WO | 2007113358 | 10/2007 |

OTHER PUBLICATIONS

International Search Report for PCT/IB2007/004584 dated Jan. 28, 2009.

International Search Report for PCT/IB2007/004586 dated Mar. 5, 2009.

International Search Report for PCT/IB2007/004643 dated Jan. 30, 2009.

(56) References Cited

OTHER PUBLICATIONS

International Search Report for PCT/US2008/085736 dated Jan. 28, 2009.

International Search Report for PCT/US2008/085754 dated Feb. 9, 2009.

International Search Report for PCT/US2008/085755 dated Feb. 3, 2009.

Kajihara, et al., "Model of Photovoltaic Cell Circuits Under Partial Shading", 2005 IEEE, pp. 866-870.

Knaupp, et al., "Operation of a 10 KW PV Façade with 100 W AC Photovoltaic Modules", 1996 IEEE, 25th PVSC, May 13-17, 1996, pp. 1235-1238, Washington, DC.

Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.

Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.

Chen, et al., "Predictive Digital Current Programmed Control", IEEE Transactions on Power Electronics, vol. 18, Issue 1, Jan. 2003.

Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.

Alonso, "A New Distributed Converter Interface for PV Panels", 20th European Photovoltaic Solar Energy Conference, Jun. 6-10, 2005, Barcelona, Spain, pp. 2288-2291.

Alonso, "Experimental Results of Intelligent PV Module for Grid-Connected PV Systems", 21st European Photovoltaic Solar Energy Conference, Sep. 4-8, 2006, Dresden, Germany, pp. 2297-2300.

Enslin, "Integrated Photovoltaic Maximum Power Point Tracking Converter", IEEE Transactions on Industrial Electronics, vol. 44, No. 6, Dec. 1997, pp. 769-773.

Lindgren, "Topology for Decentralised Solar Energy Inverters with a Low Voltage AC-Bus", Chalmers University of Technology, Department of Electrical Power Engineering, EPE '99—Lausanne.

Nikraz, "Digital Control of a Voltage Source Inverter in a Photovoltaic Applications", 2004 35th Annual IEEE Power Electronics Specialists Conference, Aachen, Germany, 2004, pp. 3266-3271.

Orduz, "Evaluation Test Results of a New Distributed MPPT Converter", 22nd European Photovoltaic Solar Energy Conference, Sep. 3-7, 2007, Milan, Italy.

Palma, "A Modular Fuel Cell, Modular DC-DC Converter Concept for High Performance and Enhanced Reliability", IEEE 2007, pp. 2633-2638.

Quaschning, "Cost Effectiveness of Shadow Tolerant Photovoltaic Systems", Berlin University of Technology, Institute of Electrical Energy Technology, Renewable Energy Section. EuroSun '96, pp. 819-824.

Roman, "Intelligent PV Module for Grid-Connected PV Systems", IEEE Transactions on Industrial Electronics, vol. 52, No. 4, Aug. 2006, pp. 1066-1073.

Roman, "Power Line Communications in Modular PV Systems", 20th European Photovoltaic Solar Energy Conference, Jun. 6-10, 2005, Barcelona, Spain, pp. 2249-2252.

Uriarte, "Energy Integrated Management System for PV Applications", 20th European Photovoltaic Solar Energy Conference, Jun. 6-10, 2005, Barcelona, Spain, pp. 2292-2295.

Walker, "Cascaded DC-DC Converter Connection of Photovoltaic Modules", IEEE Transactions on Power Electronics, vol. 19, No. 4, Jul. 2004, pp. 1130-1139.

PCT/IB2010/052287 International Search Report and Written Opinion dated Sep. 2, 2010.

\* cited by examiner

SWITCHING CIRCUIT LAYOUT WITH HEATSINK

CROSS REFERENCE TO RELATED APPLICATIONS

The present application benefits from U.S. provisional application 61/060,878 filed on Jun. 12, 2008 by the present inventors.

BACKGROUND

1. Technical Field

The present invention relates to switching converters and to specifically a circuit layout of four switches 2. Description of Related Art The thermal resistance of materials used to package electronic components is of great interest to electronic engineers, because most electrical components generate heat and need to be cooled. Electronic components need to be cooled to avoid premature aging and consequent failure. Also, effective cooling of the electronic component(s) susceptible to generating heat in a circuit allows for a stable, efficient and predictable performance of the circuit. In particular, heat generated from electronic components in power supply/conversion circuits are mostly derived from the main switching devices.

Heat sinks function by efficiently transferring thermal energy or heat from a first object at a relatively high temperature to a second object or the environment at a lower temperature with a much greater heat capacity. This rapid transfer of thermal energy quickly brings the first object into thermal equilibrium with the second object or environment, lowering the temperature of the first object thus fulfilling the role of a heat sink as a cooling device.

Figure 1A:
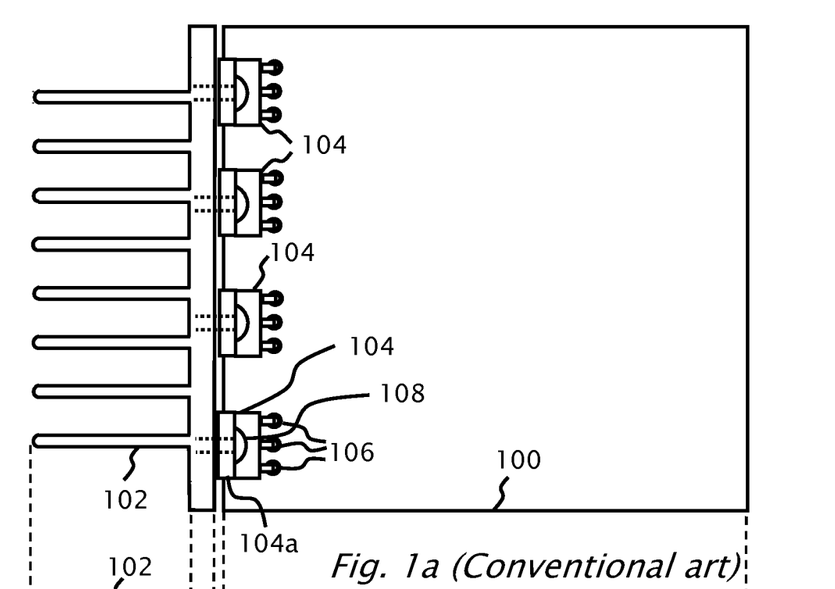
FIGS. 1a and 1b show a plan and side view of a circuit board with heat sink according to conventional art.
Figure 1B:
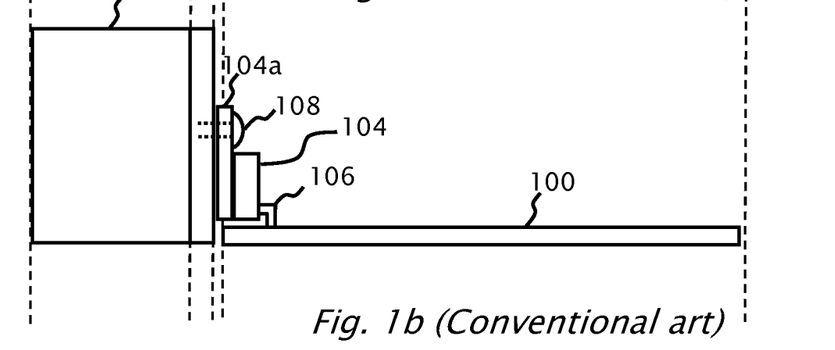

FIGS. 1a and 1b show a plan and side view respectively of a circuit board 100 with heat sink 102 according to conventional art. Four switches 104 are shown. Switches 104 are electrically connected to circuit board 100 via legs 106. Plate 104a is used to mechanically attach switch 104 to heat sink 102 using threaded screw 108. An application of a heat sink compound (typically made from zinc oxide in a silicone base) is applied between plate 104a and heat sink 102 prior to fastening with threaded screw 108. The heat sink compound allows for better heat transfer from switch 104 and heat sink 102 to allow for the uneven surfaces of either plate 104a or heat sink 102. Typically switch 104 is a semiconductor switch such as a metal oxide semi-conductor field effect transistor (MOSFET) or insulated gate bipolar transistor (IGBT).

Figure 2A:
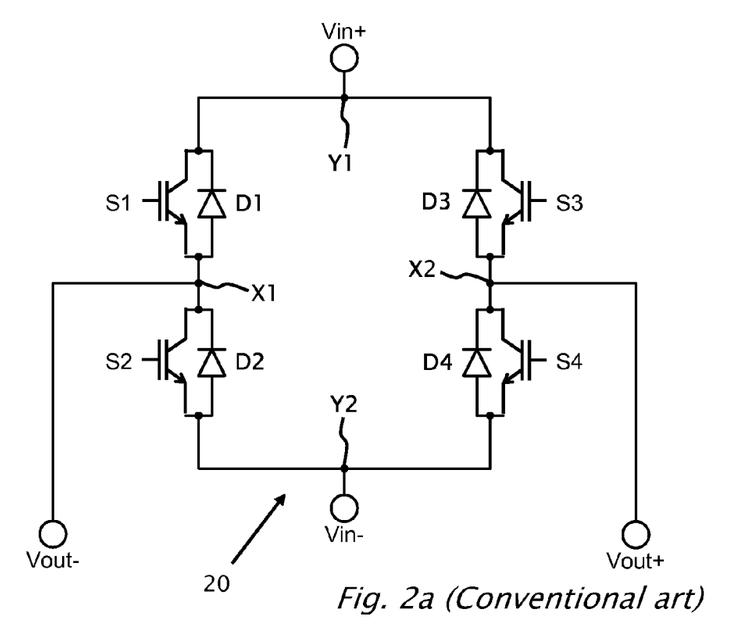
FIG. 2a shows a conventional full bridge converter according to conventional art.

FIG. 2a shows a conventional full bridge converter 20. Full bridge DC to DC converter 20 has four main switches S1, S2, S3 and S4 connected together in a full bridge configuration. Switches S1, S2, S3 and S4 are insulated gate bipolar transistors. The collectors of switch S1 and switch S3 are connected together at node Y1 and the emitters of switch S2 and switch S4 are connected together at node Y2. The emitter of switch S1 is connected to the collector of switch S2 and the emitter of switch S3 is connected to the collector of switch S4. Each of the four main switches (S1, S2, S3 and S4) has respective diode shunts (D1, D2, D3 and D4) connected in parallel thereto. The diode shunts may be inherent parasitic diodes of the IGBTs, or may be discrete components. The diodes placed across switches S1 and S2 are in both the same direction similarly the diodes of switch S3 and switch S4 are both in the same direction. In the case where full bridge converter 50 is operated as a DC-to-DC converter all diodes (D1, D2, D3 and D4) connected across switches S1, S2, S3 and S4 are reverse biased with respect to the input voltage $V_{in}$.

An input voltage ($V_{in}^-$) of full bridge converter 20 is connected across the node (Y2) between switches S2 and S4 and an input voltage ($V_{in}^+$) is connected at the node (Y1) between switches S1 and S3. An output voltage ($V_{out}^-$) of full bridge converter 20 is connected across the node (X1) between switches S1 and S2 and output voltage $V_{out}+$ is connected at the node (X2) between switches S3 and S4. Switching of full bridge converter 20 is typically done in a manner such that while switches S1 and S4 are ON, switches S3 and S2 are OFF and vice versa.

Figure 2B:
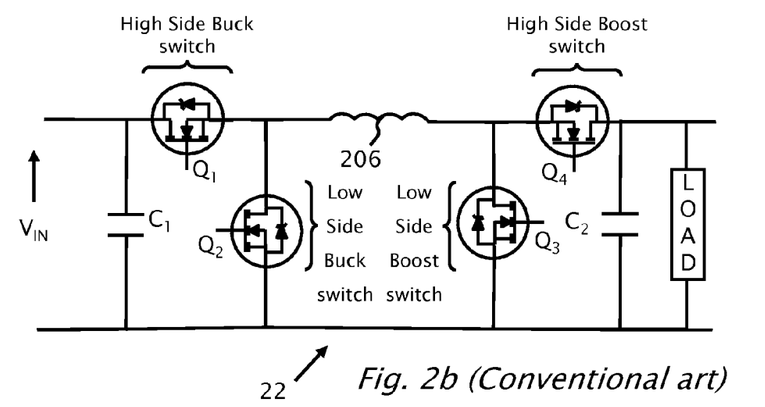
FIG. 2b shows a typical conventional buck-boost DC-to-DC converter circuit according to conventional art.

FIG. 2b shows a typical conventional buck-boost DC-to-DC converter circuit 22. The buck circuit of buck-boost DC-to-DC converter 22 has an input voltage $V_{in}$ with an input capacitor $C_1$ connected in parallel across $V_{in}$. Two switches are implemented as field effect transistors (FET) with integral diodes: a high side buck switch $Q_1$ and a low side buck switch $Q_2$ connected in series by connecting the source of $Q_1$ to the drain of $Q_2$. The drain of $Q_1$ and the source of $Q_2$ are connected parallel across an input capacitor $C_1$. A node is formed between switches $Q_1$ and $Q_2$ to which one end of an inductor 206 is connected. The other end of inductor 206 is connected to the boost circuit of buck-boost DC-to-DC converter 22 at a second connecting two switches: a high side boost switch $Q_4$ and a low side boost switch $Q_3$ together in series where the source of $Q_4$ connects to the drain of $Q_3$ to form node B. The drain of $Q_4$ and the source of $Q_3$ connect across an output capacitor $C_2$ to produce the output voltage $V_{out}$ of buck-boost DC-to-DC converter 22.

At higher switching frequencies of switched inverters/converters, lower values of reactive components can be used in circuit to achieve the required output characteristics of the inverters/converters. However, the increase in frequency can have the undesirable effect of increasing electromagnetic interference (EMI) if good circuit design and good circuit layout practices are not followed. Remembering that currents flowing in a closed path, i.e. a loop (formed by circuit board traces) acts as an efficient radiator of electromagnetic energy, maximum radiation efficiency occurs when the loop dimension is on the order of one-half wavelength. To minimize the radiation efficiency, that is to reduce radiated noise, the loop is made as physically small as possible by being aware of parasitic inductances in the board traces. High-frequency currents follow the path of least impedance (and not the path of least resistance) and a way to reduce the inductive impedance ($X_L=2\pi fL$) of parasitic inductances (L) is to reduce the frequency (f) or to reduce the size of the loop, since a longer loop gives more parasitic inductance (L). Power loss (P) in the loop is the product of the inductive impedance ($X_L$) squared and the high frequency current in the loop.

Both static and dynamic power losses occur in any switching inverter/converter. Static power losses include $I^2R$ (conduction) losses in the wires or PCB traces, as well as in the switches and inductor, as in any electrical circuit. Dynamic power losses occur as a result of switching, such as the charging and discharging of the switch gate, and are proportional to the switching frequency.

BRIEF SUMMARY

According to an embodiment of the present invention there is provided a circuit board adapted for use in a switching converter for connecting a plurality of switches including a first switch, a second switch, a third switch and a fourth switch. The circuit board has a layout for connecting the switches. The layout is adapted for locating the switches substantially at the endpoints of a right-angle cross. The layout is adapted for locating the switches substantially symmetrically with respect to the endpoints of the right-angle cross. The right-angle cross is formed from two line segments intersecting with a ninety degree angle. The circuit board offsets all the switches perpendicularly to the line segments at the endpoints of the line segments either in a clockwise or a counterclockwise direction. The layout typically includes a respective cutout for the switches. The switches are typically chassis mounted.

According to yet another embodiment of the present invention there is provided a switching converter having multiple switches including a first switch, a second switch, a third switch and a fourth switch. A circuit board has a layout for connecting the switches. The layout locates the switches substantially at the endpoints of a right-angle cross or substantially symmetrically with respect to the endpoints of the right-angle cross. The switches are interconnected in a full bridge switching topology. The switches are interconnected in a buck-boost switching topology. A heat-sink is operatively attached to the switches for conducting heat from the switches. The switches are preferably insulated gate bipolar junction transistors (IGBT). The layout includes cutouts for the switches, having a chassis mounting for the insulated gate bipolar junction transistors; and a heat sink attached to the transistors and the chassis. The right-angle cross is formed from two line segments intersecting with a ninety degree angle. The circuit board may offset the switches perpendicularly to the line segments at the endpoints of the line segments either in a clockwise or a counterclockwise direction, thereby forming the layout of the switches in the shape of a fylfot cross. The first switch and the third switch are at the endpoints of the first line segment forming a first pair of the switches and the second switch and the fourth switch are at the endpoints of the second line segment forming a second pair of the switches. The switching converter switches alternately the first pair of switches and the second pair of switches. The right-angle cross is formed from two line segments intersecting with substantially a ninety degree angle. The circuit board may offset only two of the switches perpendicularly to one of the line segments at the endpoints of the one line segment either in a clockwise or an counterclockwise direction. The switching converter is mounted vertically so that the one line segment is substantially vertical and one of the two switches is substantially below the second of the two switches so that while the switching converter is operating, the heat from the lower of the two switches does not flow near the upper of the two switches. The first switch, the second switch, the third switch and the fourth switch may include: silicon controlled rectifier (SCR), insulated gate bipolar junction transistor (IGBT), bipolar junction transistor (BJT), field effect transistor (FET), junction field effect transistor (JFET), switching diode, electrical relay, reed relay, solid state relay, insulated gate field effect transistor (IGFET), diode for alternating current (DIAC), and/or triode for alternating current TRIAC.

BRIEF DESCRIPTION OF THE DRAWINGS

The invention is herein described, by way of example only, with reference to the accompanying drawings, wherein:

FIG. 1b shows a plan and side view of the circuit board with heat sink 102 shown in FIG. 1a according to conventional art;

The foregoing and/or other aspects will become apparent from the following detailed description when considered in conjunction with the accompanying drawing figures.

DETAILED DESCRIPTION

Reference will now be made in detail to embodiments of the present invention, examples of which are illustrated in the accompanying drawings, wherein like reference numerals refer to the like elements throughout. The embodiments are described below to explain the present invention by referring to the figures.

By way of introduction, an intention of embodiments of the present invention is to minimize the lengths of the conductors between switches of a switching converter/inverter, minimizing interference due to parasitic capacitance and inductance, reducing electro-magnetic interference (EMI) emissions and thereby maximizing the efficiency of the switching converter.

It should be noted, that although the discussion herein relates to switching topology for a four insulated gate bipolar junction transistors (IGBT) full bridge inverter, the present invention may, by non-limiting example, alternatively be configured as well using other types of DC-DC converters AC-DC inverters including buck, boost, buck-boost full bridge topologies with 4 switch topologies for both power supply and regulation applications.

Before explaining embodiments of the invention in detail, it is to be understood that the invention is not limited in its application to the details of design and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

The term "switch" as used herein refers to any type of switch known in the art of electronics switches such as silicon controlled rectifier (SCR), insulated gate bipolar junction transistor (IGBT), metal oxide semi-conductor field effect transistor (MOSFET), bipolar junction transistor (BJT), field effect transistor (FET), junction field effect transistor (JFET), switching diode, electrical relay, reed relay, solid state relay, insulated gate field effect transistor (IGFET), DIAC, and TRIAC.

The term "switching converter" as used herein applies to power converters, AC-to-DC converters, DC-to-DC converters, DC-to-AC inverters, buck converters, boost converters, buck-boost converters, full-bridge converters or any other type of electrical power conversion/inversion known in the art.

Figure 3A:
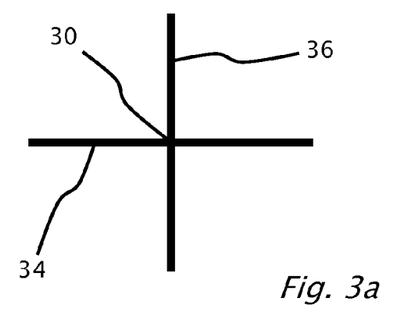
FIG. 3a shows a right-angle cross topology according to an exemplary embodiment of the present invention.

With reference to FIG. 3a, the term "right-angle cross" as used herein is a cross of two line segments (arm 36 and arm 34) typically at or near their center points 30 at or close to right angles (e.g. about 80-100 degrees). The two line segments are optionally of equal length or unequal length.

Figure 3B:
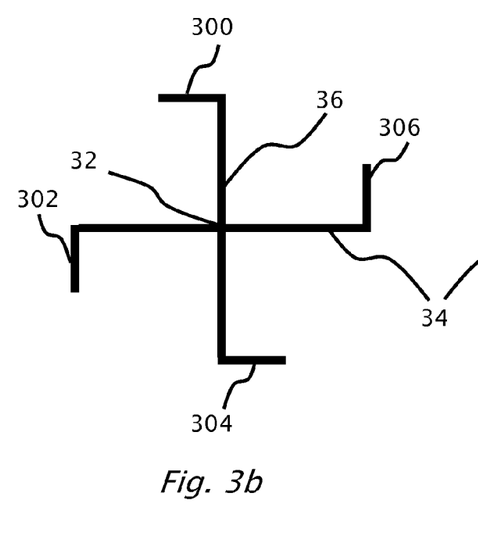
FIG. 3b shows a fylfot cross topology according to an exemplary embodiment of the present invention.
Figure 3C:
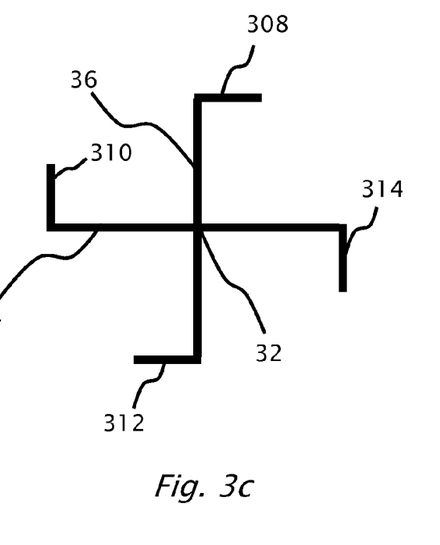
FIG. 3c shows another fylfot cross topology according to an exemplary embodiment of the present invention.

With reference to FIGS. 3b and 3c the term "fylfot cross" as used herein has two arms; arm 36 and arm 34 which are crossed a right angles at a point 32. Arm 36 at each end has a hand 300 and a hand 304 which are offset perpendicular to arm 36 in an anti-clockwise direction in FIG. 3b. Arm 34 at each end has a hand 302 and a hand 306 which are offset perpendicular to arm 34 in an anti-clockwise direction in FIG. 3b. In FIG. 3c, arm 36 at each end has a hand 312 and a hand 308 which are offset perpendicular to arm 36 in a clockwise direction. Arm 34 at each end has a hand 310 and a hand 314 which are offset perpendicular to arm 34 in a clockwise direction in FIG. 3c.

Figure 4A:
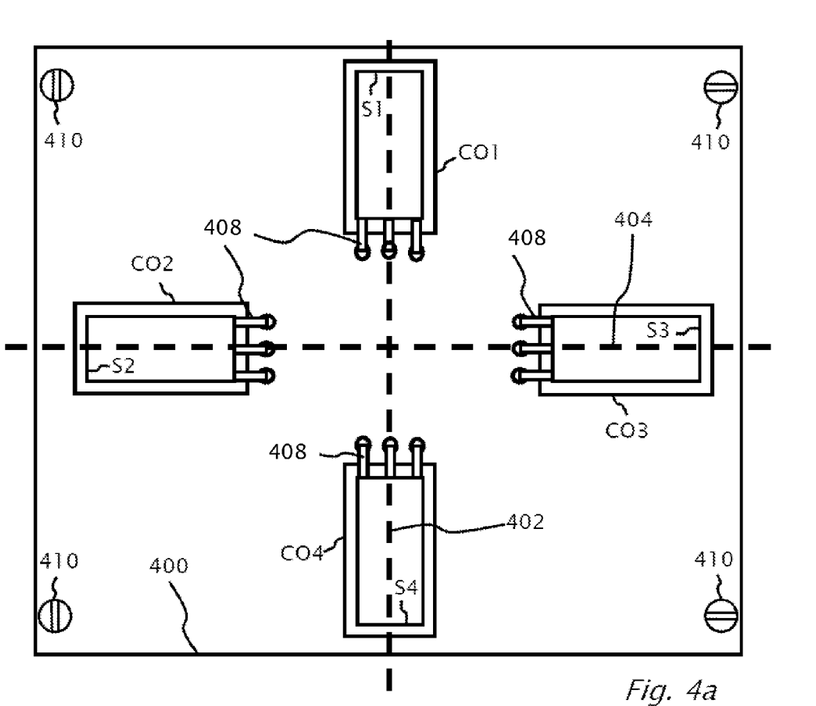
FIG. 4a shows a plan view of a circuit board and heat sink according to an exemplary embodiment of the present invention.
Figure 4B:
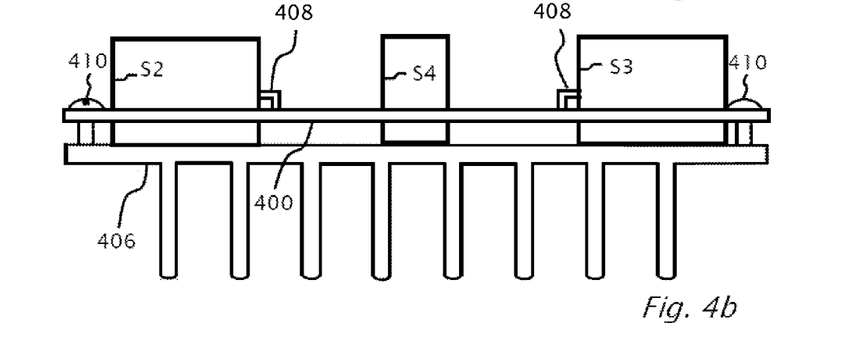
FIG. 4b which shows the side view of the circuit board and heat sink shown in FIG. 4a according to an exemplary embodiment of the present invention.

Reference is now made to FIGS. 4a and 4b which show a plan and side view respectively of a circuit board 400 and heat sink 406 according to an exemplary embodiment of the present invention. Circuit board 400 has four switches S1, S2, S3 and S4 connected electrically to circuit board 400 via leads 408. Switches S1, S2, S3 and S4 are preferably insulated gate bipolar junction transistors (IGBTs). Switches S1, S2, S3 and S4 are preferably connected electrically together according to full bridge converter 20 shown in FIG. 2a. Circuit board 400 is mechanically attached to heat sink 406 for instance via a screw and pillar arrangement 410. Switches S1, S2, S3 and S4 are mechanically and thermally attached to heat sink 406. Cutouts C01, C02, C03 and C04 in circuit board 400 allow the mechanical and thermal attachment of switches S1, S2, S3 and S4 to heat sink 406.

The layout of switches S1, S2, S3 and S4 is based upon a right-angle cross topology with dotted lines 404 and 402 forming the two arms of the right-angle cross topology. Switches S1 and S4 lay on or symmetrically with respect to arm/axis 402 and switches S2 and S3 lay on an arm/axis 404. The intersection between arm/axis 402 and arm/axis 404, forms the cross portion of right-angle cross topology. In further embodiments of the present invention, perpendicular offsets of switches S1, S4, S2 and S3 (and cutouts C01, C02, C03 and C04 in circuit board 400) relative to arms/axis 402 and arm/axis 404 respectively are made such that the offsets are in either a clockwise or anti-clockwise direction. Typically a 50% switching duty cycle is applied to S1, S2, S3 and S4 such that while switches S1 and S4 are ON, switches S3 and S2 are OFF and vice versa. Typically circuit board 400 and heat sink 406 are mounted vertically so that the flow of heat in heat sink 506 generated by switches S1, S2, S3 and S4 flows vertically by convection. Using the plan view of FIG. 4a as the vertical mounting of circuit board 400 and heat sink 406, layout of switches S1, S2, S3 and S4 are such that for example; the heat in heat sink 406 from switches S2 and S3 does not flow near switches S1 and S4 and the distance between S1 and S4 is such that the vertical flow of heat in heat sink 406 of switches S1 and S4 does not affect each other. Alternatively just switches S1 and S4 can be offset in either a clockwise or anti-clockwise direction, so that the vertical flow of heat in heat sink 406 of switches S1 and S4 does not affect each other.

In a typical computer aided design/simulation of circuit board 400, perpendicular offsets of switches S1, S4, S2 and S3 relative to arms/axis 402 and arm/axis 404 respectively and the distance between switches S1 and S4 along arm/axis 402 and switches S2 and S3 along arm/axis 404 respectively, are preferably chosen in order to achieve minimal electromagnetic interference (EMI), minimal impedance of circuit board 400 traces and efficient heat transfer between switches S1, S2, S3 and S4 and heat sink 406.

Figure 5A:
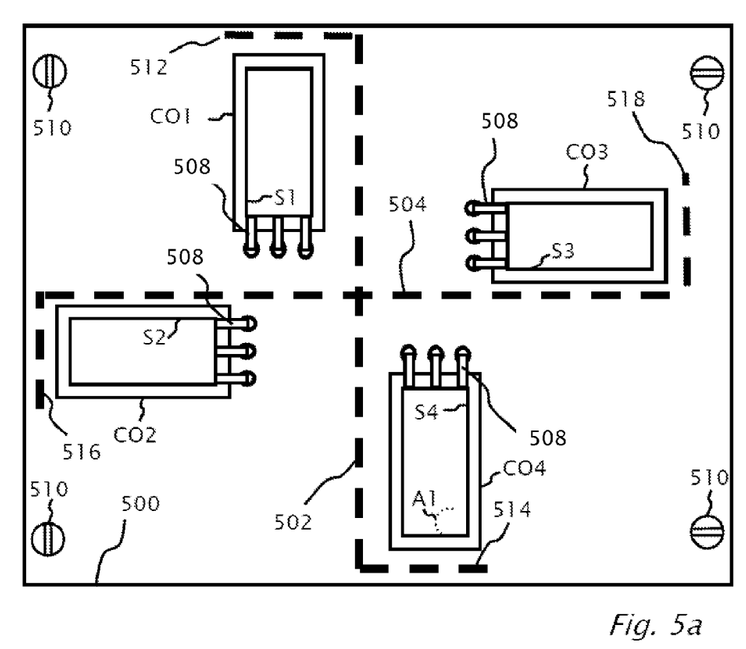
FIG. 5a shows a plan view of a circuit board and heat sink according to another exemplary embodiment of the present invention.
Figure 5B:
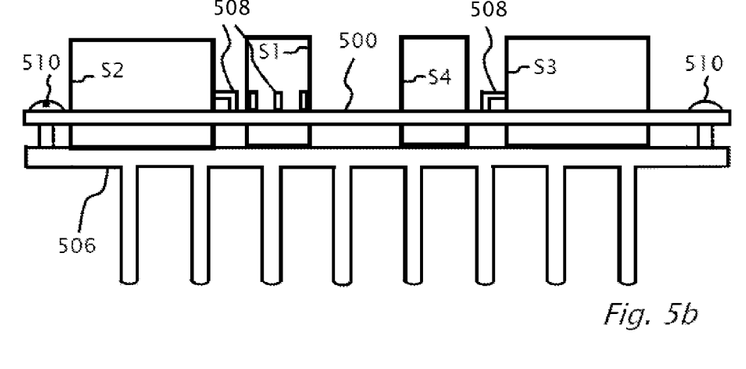
FIG. 5b which shows the side view of the circuit board and heat sink shown in FIG. 5a according to an exemplary embodiment of the present invention.

Reference is now made to FIGS. 5a and 5b which show a plan and side view respectively of a circuit board 500 and heat sink 506 according to an exemplary embodiment of the present invention. Circuit board 500 has four switches S1, S2, S3 and S4 connected electrically to circuit board 500 via leads 508. Switches S1, S2, S3 and S4 are preferably insulated gate bipolar junction transistors (IGBTs). Switches S1, S2, S3 and S4 are preferably connected electrically together according to full bridge converter 20 shown in FIG. 2a. Circuit board 500 is mechanically attached to heat sink 506 via a screw and pillar arrangement 510. Switches S1, S2, S3 and S4 are mechanically and thermally attached to heat sink 506. Cutouts C01, C02, C03 and C04 in circuit board 500 allow the mechanical and thermal attachment of switches S1, S2, S3 and S4 to heat sink 506.

Referring again to FIG. 5a, the layout of switches S1, S2, S3 and S4 is based upon a fylfot cross topology. Switches S1 and S4 lay parallel to arm/axis 502 and switches S2 and S3 lay parallel to arm/axis 504. The intersection between arm/axis 502 and arm/axis 504, form the right-angle cross portion of the fylfot cross topology. The hands of the fylfot cross topology are represented by dotted lines as hand 512, hand 516, hand 514 and hand 518. Hand 512 and hand 514 represent respectively the offsets of switches S1 and S4 with respect to arm/axis 502. Hand 516 and hand 518 represent respectively the offsets of switches S2 and S3 with respect to arm/axis 504. In FIG. 5a hand 512, hand 516, hand 514 and hand 518 are offset from axis/arms 502 and 504 in an anti-clockwise direction, alternatively hand 512, hand 516, hand 514 and hand 518 may be offset from axis/arms 502 and 504 in a clockwise direction. Typically circuit board 500 and heat sink 506 are mounted vertically so that the flow of heat in heat sink 506 generated by switches S1, S2, S3 and S4 flows vertically by convection. Using the plan view of FIG. 5a as an example of vertically mounting circuit board 500 and heat sink 506, the layout of switches S1, S2, S3 and S4 are such that for example; the vertical flow of heat from switch S2 does not significantly run into the vertical heat flow of switch S1, the vertical flow of heat from switch S1 does not significantly run into the vertical heat flow of switch S4 and the vertical flow of heat from switch S4 does not run significantly into the vertical heat flow of switch S3.

The definite articles "a", "an" is used herein, such as "a switch converter", "a switch" have the meaning of "one or more" that is "one or more switch converters" or "one or more switches".

Although selected embodiments of the present invention have been shown and described, it is to be understood the present invention is not limited to the described embodiments. Instead, it is to be appreciated that changes may be made to these embodiments without departing from the principles and spirit of the invention, the scope of which is defined by the claims and the equivalents thereof.

The invention claimed is:
1. A switching converter comprising:
a plurality of switches including a first switch, a second switch, a third switch and a fourth switch;
a circuit board having a layout for connecting said switches, wherein said layout locates said switches substantially at endpoints of a right-angle cross, wherein said layout includes cutouts at the endpoints of said right angle cross, and wherein said switches are located within said cutouts;
a chassis mounting said switches; and
a heat sink attached to said switches and said chassis.

2. The switching converter of claim 1, wherein said layout is adapted for locating said switches substantially symmetrically with respect to the endpoints of said right-angle cross.

3. The switching converter of claim 1, wherein said switches are interconnected in a full bridge switching topology.

4. The switching converter of claim 1, wherein said switches are interconnected in a buck-boost switching topology.

5. The switching converter of claim 1, wherein said heat sink conducts heat from said switches.

6. The switching converter of claim 1, wherein said first switch, said second switch, said third switch and said fourth switch are selected from the group consisting of:
a silicon controlled rectifier (SCR), an insulated gate bipolar junction transistor (IGBT), a bipolar junction transistor (BJT), a field effect transistor (FET), a junction field effect transistor (JFET), a switching diode, an electrical relay, a reed relay, a solid state relay, an insulated gate field effect transistor (IGFET), a diode for alternating current (DIAC), and a triode for alternating current (TRIAC).

7. The switching converter of claim 1, wherein said switches are insulated gate bipolar junction transistors (IGBT).

8. The switching converter of claim 1, wherein said right-angle cross is formed from two line segments intersecting with a ninety degree angle, wherein the circuit board offsets all said switches perpendicularly to said line segments at the endpoints of the line segments either in a clockwise or a counterclockwise direction, thereby forming said layout of said switches in a shape of a fylfot cross.

9. The switching converter of claim 1, wherein said right-angle cross is formed from two line segments, including a first line segment and a second line segment intersecting with a ninety degree angle, wherein said first switch and said third switch are at the endpoints of said first line segment forming a first pair of said switches and said second switch and said fourth switch are at the endpoints of said second line segment forming a second pair of said switches, and wherein the switching converter switches alternately said first pair of said switches and said second pair of said switches.

10. The switching converter of claim 1, wherein said right-angle cross is formed from two line segments intersecting with a ninety degree angle, wherein the circuit board offsets only two of said switches perpendicularly to one of said line segments at the endpoints of said one line segment either in a clockwise or a counterclockwise directions.

11. The switching converter of claim 10, wherein, when the switching converter is mounted vertically, said one line segment is substantially vertical and one of said two switches is substantially below and offset horizontally from the second of said two switches so that while the switching converter is operating heat from the lower of said two switches does not flow vertically near the upper of said two switches.

12. A switching converter comprising:
a chassis;
a heat sink;
a circuit board having a first switch, a second switch, a third switch and a fourth switch connected thereto, wherein the circuit board includes cutouts, wherein said switches are located within the cutouts and mounted to the heat sink, wherein the heat sink and circuit board are mounted vertically within the chassis, and wherein the switches are located such that heat from any one of the switches does not flow vertically through the heat sink to the other switches.

\* \* \* \* \*

UNITED STATES PATENT AND TRADEMARK OFFICE
CERTIFICATE OF CORRECTION

| | |
|---|---|
| PATENT NO. | : 8,630,098 B2 |
| APPLICATION NO. | : 12/483933 |
| DATED | : January 14, 2014 |
| INVENTOR(S) | : Lior Handelsman et al. |

It is certified that error appears in the above-identified patent and that said Letters Patent is hereby corrected as shown below:

On the Title Page
(57) Abstract, Line 1:
    Please delete "an" and insert --a--

In the Drawings
Sheet 2 of 5, FIG. 2a:
    Delete "Vin+" and insert --$V_{in+}$--

Sheet 2 of 5, FIG. 2a:
    Delete "Vout-" and insert --$V_{out-}$--

Sheet 2 of 5, FIG. 2a:
    Delete "Vin-" and insert --$V_{in-}$--

Sheet 2 of 5, FIG. 2a:
    Delete "Vout+" and insert --$V_{out+}$--

In the Specification
Column 1, Background, Line 65:
    Delete "50" and insert --20--

Column 5, Detailed Description, Line 44:
    Delete "C01" and insert --CO1--

Column 5, Detailed Description, Line 45:
    Delete "C04" and insert --CO4--

In the Claims
Column 8, Claim 12, Line 26:
    In Claim 12, after "sink;", insert --and--

Signed and Sealed this
Thirty-first Day of March, 2015

Michelle K. Lee
*Director of the United States Patent and Trademark Office*